(12) United States Patent
Fujimura

(10) Patent No.: US 7,596,201 B2
(45) Date of Patent: Sep. 29, 2009

(54) GRAY CODE COUNTER AND DISPLAY DEVICE THEREWITH

(75) Inventor: Norio Fujimura, Anpachi-cho (JP)

(73) Assignee: Epson Imaging Devices Corporation, Azumino-shi (JP)

( * ) Notice: Subject to any disclaimer, the term of this patent is extended or adjusted under 35 U.S.C. 154(b) by 19 days.

(21) Appl. No.: 12/036,031

(22) Filed: Feb. 22, 2008

(65) Prior Publication Data
US 2008/0224904 A1    Sep. 18, 2008

(30) Foreign Application Priority Data

Mar. 15, 2007  (JP) .............................. 2007-066104
Mar. 23, 2007  (JP) .............................. 2007-075958

(51) Int. Cl.
*H03K 21/00* (2006.01)
(52) U.S. Cl. .......................................... 377/34; 377/52
(58) Field of Classification Search .................. 377/34, 377/52, 107; 341/97, 98
See application file for complete search history.

(56) References Cited

U.S. PATENT DOCUMENTS

| | | | | |
|---|---|---|---|---|
| 5,164,968 A | * | 11/1992 | Otto | .............................. 377/34 |
| 5,748,949 A | * | 5/1998 | Johnston | ...................... 713/502 |
| 2003/0179848 A1 | * | 9/2003 | Nakamura | .................... 377/34 |

FOREIGN PATENT DOCUMENTS

| | | |
|---|---|---|
| JP | 06-053818 A | 2/1994 |
| JP | 2003-283331 A | 10/2003 |

* cited by examiner

*Primary Examiner*—Tuan Lam
(74) *Attorney, Agent, or Firm*—Morrison & Foerster LLP

(57) ABSTRACT

There is offered a Gray code counter with which a delay time of a critical path is reduced and a fast operation is made possible. A first Gray code bit Q0 is obtained by outputting an output signal Q0o of an RDFF 2 through an RDFF 31 to synchronize with a clock CLK. A second Gray code bit Q1 is obtained by outputting an output signal Q1o of an RDFF 2 through an RDFF 32 to synchronize with the clock CLK. A third Gray code bit Q2 is obtained by delaying an output signal Q2o of an RDFF 4 with a selection circuit 21 and outputting it through an RDFF 33 to synchronize with the clock CLK. A fourth Gray code bit Q3 is obtained by delaying an output signal Q3o of an RDFF 5 with an AND circuit 11 and a selection circuit 22 and outputting it through an RDFF 34 to synchronize with the clock CLK. Higher bits of the Gray code are similarly generated.

6 Claims, 4 Drawing Sheets

GRAY CODE COUNTER AND DISPLAY DEVICE THEREWITH

CROSS-REFERENCE OF THE INVENTION

This application claims priority from Japanese Patent Application Nos. 2007-066104 and 2007-075958, the contents of which are incorporated herein by reference in their entirety.

BACKGROUND OF THE INVENTION

1. Field of the Invention

This invention relates to a gray code counter and a display device provided with the gray code counter.

2. Description of the Related Art

There has been known a Gray code counter that counts a number of clocks and outputs a Gray code according to the number of clocks counted. The Gray code is a binary code in which a change between two successive numbers is represented by a change from "0" to "1" or from "1" to "0" in only one bit. The Gray code counter can reduce power consumption and a counting error compared with other common counters. Detailed information on the Gray code counter is disclosed in Japanese patent Application Publication Nos. H6-53818 and 2003-283331, for example.

With the conventional Gray code counter, however, there is a problem that high speed operation is not possible because a Gray code generation circuit is too complicated and a critical path that determines a delay time of a signal is too long.

SUMMARY OF THE INVENTION

This invention offers a Gray code counter that generates a Gray code having a divider circuit that halves a frequency of a clock made of an (n-1)th bit of the Gray code which is lower by one bit than an nth bit of the Gray code, a delay circuit that delays an output of the divider circuit based on an (n-2)th bit and lower bits of the Gray code, and a sequential circuit that holds, delays and outputs an output of the delay circuit in response to a clock.

This invention also offers a display device provided with the Gray code counter described above.

BRIEF DESCRIPTION OF THE DRAWINGS

FIG. 3 shows a Gray code generated by the Gray code counter according to the embodiment of this invention.

DETAILED DESCRIPTION OF THE INVENTION

Figure 1:
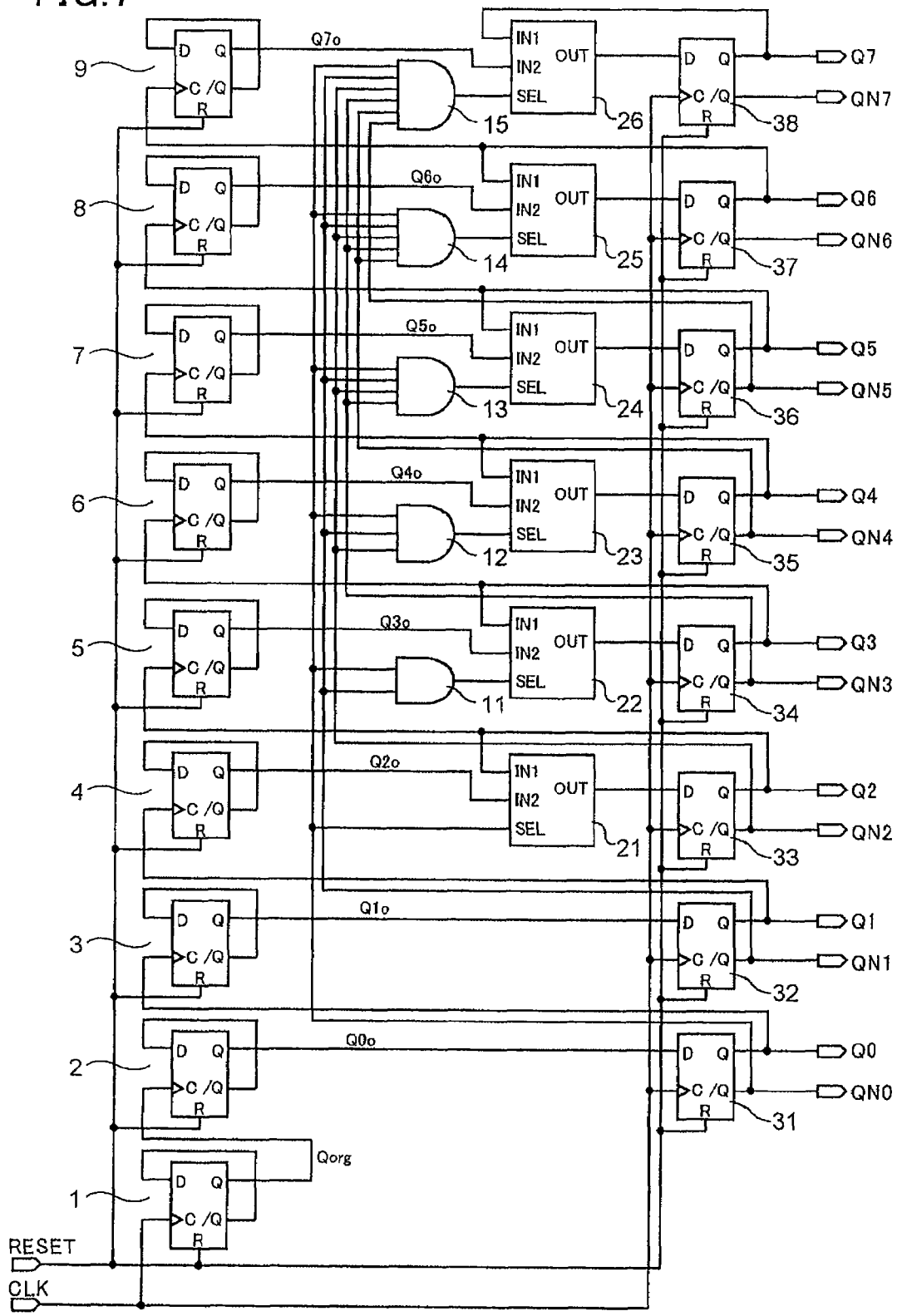
FIG. 1 is a circuit diagram showing a Gray code counter according to an embodiment of this invention.

An embodiment of this invention will be described referring to the drawings. FIG. 1 is a circuit diagram of an 8-bit Gray code counter according to the embodiment of this invention. The Gray code counter is composed of D-type flip-flops (hereafter referred to as RDFFs) 1-9 each having a reset terminal R, AND circuits 11-15, selection circuits 21-26 and D-type flip-flops (hereafter referred to as RDFFs) 31-38 each having a reset terminal R. Each of Gray code bits Q0-Q7 (Q0 corresponds to a first bit and Q7 corresponds to an eighth bit.) is outputted from an output terminal Q of corresponding each of eight RDFFs 31-38, which is a sequential circuit, respectively.

Each of the RDFFs 1-9 makes a divider that halves a frequency of a clock inputted to a clock input terminal C by feeding back a reverse output signal from its reverse output terminal /Q to its data input terminal D, and is reset by a reset signal RESET. The RDFF 1 halves a frequency of a clock CLK and outputs a reference clock Qorg from an output terminal Q. The RDFF 2 further halves a frequency of the reference clock Qorg and outputs a signal Q0o from an output terminal Q. Each of the RDFFs 3-9 halves a frequency of a clock which is made of one bit lower bit of the Gray code bits Q0-Q6, and outputs corresponding each of signals Q1o-Q7o from an output terminal Q.

Each of selection circuits 21-26 corresponds to each of the third through eighths Gray code bits Q2-Q7, respectively, and outputs a signal inputted to a first input terminal IN1 from an output terminal OUT when a selection signal inputted to a selection signal input terminal SEL is "0" and outputs a signal inputted to a second input terminal IN2 from the output terminal OUT when the selection signal inputted to the selection signal input terminal SEL is "1". The selection circuits 21-26 can be formed of simple switching circuits. The first input terminal IN1 of each of the selection circuits 21-26 receives corresponding each of the Gray code bits Q2-Q7 while the second input terminal IN2 of each of the selection circuits 21-26 receives corresponding each of the output signals Q2o-Q7o, which is outputted from the output terminal Q of corresponding each of RDFFs 4-9, respectively.

Regarding the selection circuit 21, the selection signal is a reverse signal QN0 that is a reverse of the first Gray code bit Q0. Regarding the selection circuits 22-26, each of the selection signals is generated by corresponding each of AND circuits (logic circuits) 11-15, respectively. Each of the AND circuits 11-15 corresponds to each of the fourth through eighth Gray code bits Q3-Q7, respectively, and generates a logical product of reverse signals of the first Gray code bit Q0 through two bit lower Gray code bit.

Regarding the fourth Gray code bit Q3, for example, the AND circuit 11 generates a logical product of reverse Gray code bits QN0 and QN1 that are reverse codes of the first and second Gray code bits Q0 and Q1. That is, the selection circuits 21-26 and the AND circuits 11-15 constitute delay circuits that delay the output signals of RDFFs 4-9 by masking for a certain period of time based on the lower Gray code bits.

Figure 2:
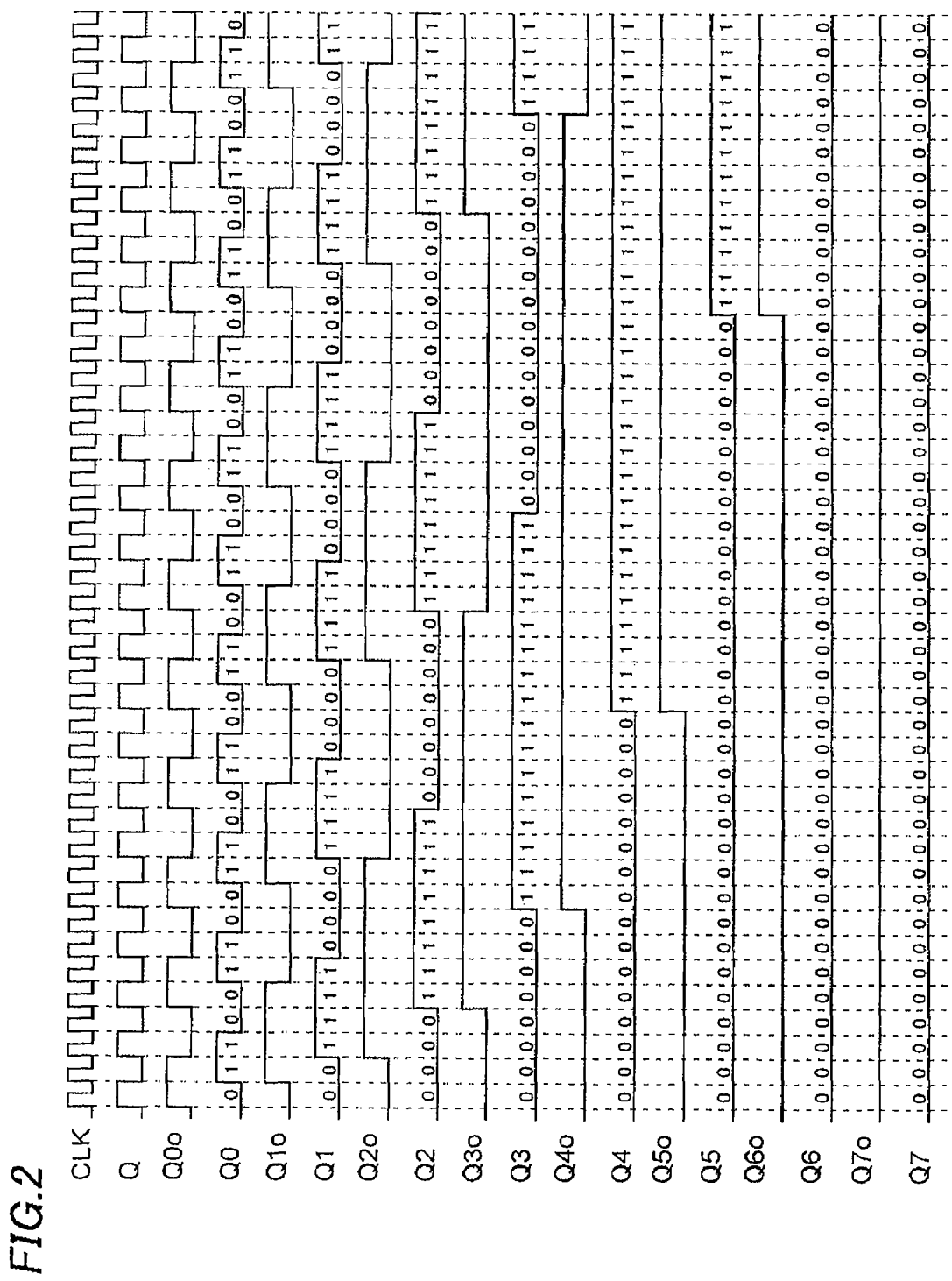
FIG. 2 is an operational timing chart showing an operation of the Gray code counter according to the embodiment of this invention.
Figure 3:
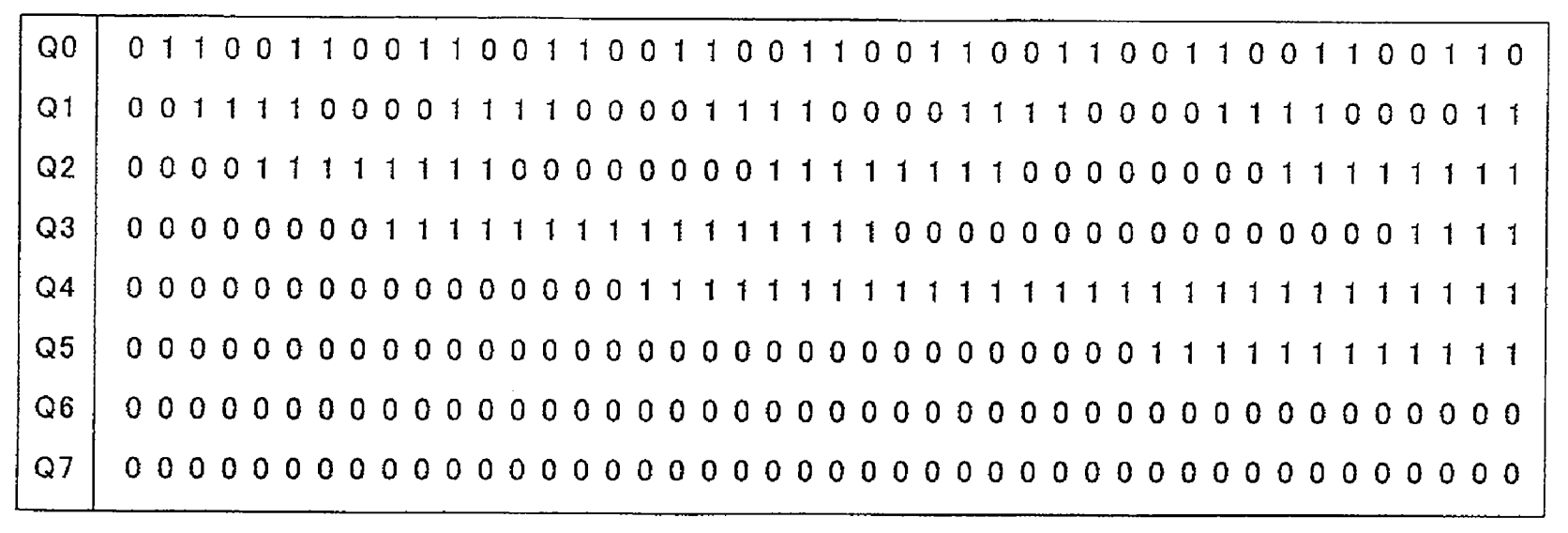

Next, how each of the Gray code bits Q0-Q7 is generated in the Gray code counter described above is explained concretely, referring to the circuit diagram shown in FIG. 1, an operational timing chart shown in FIG. 2 and a Gray code shown in FIG. 3. Note that FIG. 2 and FIG. 3 show only a first portion of the Gray code for the sake of convenience. The Gray code counter begins its operation after the RDFFs 1-9 and the RDFFs 31-38 are reset by the reset signal RESET.

The first Gray code bit Q0 is obtained by outputting the output signal Q0o of the RDFF 2 through the RDFF 31 to synchronize with the clock CLK. That is, the RDFF 31 takes in and holds the output signal Q0o of the RDFF 2 in synchronization with a rise of the clock CLK, and outputs it from the output terminal Q in synchronization with a subsequent rise of the clock CLK. Similarly, the second Gray code bit Q1 is obtained by outputting the output signal Q1o of the RDFF 3 through the RDFF 32 to synchronize with the clock CLK.

The third Gray code bit Q2 is obtained by delaying the output signal Q2o of the RDFF 4 with the selection circuit 21 and outputting it through the RDFF 33 to synchronize with the clock CLK. That is, the selection circuit 21 selects the output signal Q2o and outputs it to the RDFF 33 when the first reverse Gray code bit QN0 is "1".

The fourth Gray code bit Q3 is obtained by delaying the output signal Q3o of the RDFF 5 with the AND circuit 11 and the selection circuit 22 and outputting it through the RDFF 34 to synchronize with the clock CLK. That is, since an output of the AND circuit 11 is "1" when the first reverse Gray code bit QN0 and the second reverse Gray code bit QN1 are "1", the selection circuit 22 selects the output signal Q3o and outputs it to the RDFF 34 in this case.

The fifth Gray code bit Q4 is obtained by delaying the output signal Q4o of the RDFF 6 with the AND circuit 12 and the selection circuit 23 and outputting it through the RDFF 35 to synchronize with the clock CLK. That is, since an output of the AND circuit 12 is "1" when QN0, QN1 and QN2 are "1", the selection circuit 23 selects the output signal Q4o and outputs it to the RDFF 35 in this case.

The sixth Gray code bit Q5 is obtained by delaying the output signal Q5o of the RDFF 7 with the AND circuit 13 and the selection circuit 24 and outputting it through the RDFF 36 to synchronize with the clock CLK. That is, since an output of the AND circuit 13 is "1" when QN0, QN1, QN2 and QN3 are "1", the selection circuit 24 selects the output signal Q5o and outputs it to the RDFF 36 in this case.

The seventh Gray code bit Q6 is obtained by delaying the output signal Q6o of the RDFF 8 with the AND circuit 14 and the selection circuit 25 and outputting it through the RDFF 37 to synchronize with the clock CLK. That is, since an output of the AND circuit 14 is "1" when QN0, QN1, QN2, QN3 and QN4 are "1", the selection circuit 25 selects the output signal Q6o and outputs it to the RDFF 37 in this case.

The eighth Gray code bit Q7 is obtained by delaying the output signal Q7o of the RDFF 9 with the AND circuit 15 and the selection circuit 26 and outputting it through the RDFF 38 to synchronize with the clock CLK. That is, since an output of the AND circuit 15 is "1" when QN0, QN1, QN2, QN3, QN4 and QN5 are "1", the selection circuit 26 selects the output signal Q7o and outputs it to the RDFF 38 in this case.

The AND circuits 11-26 may be replaced with NOR circuits to which corresponding Gray code bits are inputted. For example, the AND circuit 11 is equivalent to a NOR circuit to which the first Gray code bit Q0 and the second Gray code bit Q1 are inputted.

A 9-bit Gray code counter and a more than 9-bit Gray code counter are similar to the 8-bit Gray code counter described above. In general, an n th Gray code bit (n is a natural number larger than three.) is obtained by delaying an output of a divider circuit corresponding to the n th Gray code bit with an AND circuit and a selection circuit and outputting it through an RDFF to synchronize with the clock CLK. In this case, the AND circuit takes in (n-2) bits of reverse Gray code bits that are the first through (n-2) th reverse Gray code bits.

The selection circuit selects an output of the divider circuit when an output of the AND circuit is "1", and selects an output of an RDFF when the output of the AND circuit is "0". The NAND circuit may be replaced with a NOR circuit receiving (n-2) Gray code bits which are the first through the (n-2) th Gray code bits.

According to the embodiment of this invention, as described above, the Gray code counter that is simple in the circuit structure, reduced in a delay time of a critical path and capable of fast operation is made available, since each of the lower Gray code bits is composed of the divider circuit and the RDFF only, and each of the higher Gray code bits is composed of the divider circuit, the AND circuit, the selection circuit and the RDFF only. In particular, the delay time of the critical path, i.e. a path from the divider to the output RDFF, corresponding to each of the higher Gray code bits is very short, because the input signals to the AND circuit are the lower bit Gray code bits which are already established by the time when they are required. Also, because the selection circuit only makes a selection between two signals, the delay time is very short.

Figure 4:
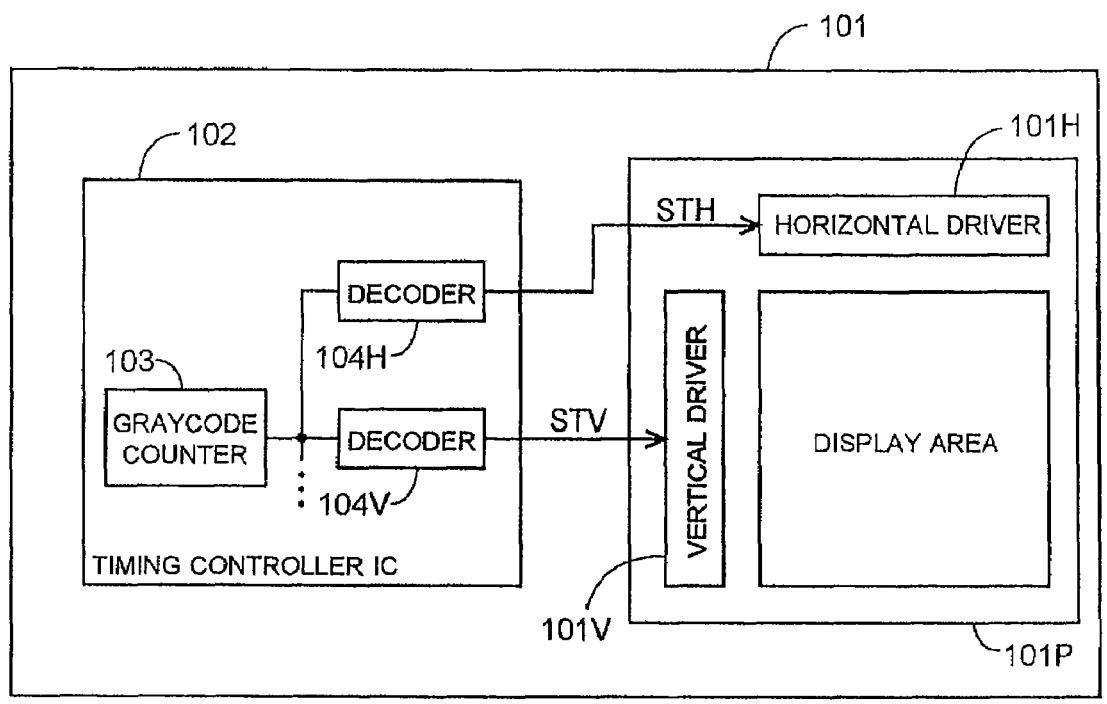
FIG. 4 is a block diagram showing a liquid crystal display device using the Gray code counter according to the embodiment of this invention.

Next, a liquid crystal display device using the Gray code counter according to the embodiment of this invention is described. FIG. 4 is a block diagram showing the liquid crystal display device. The liquid crystal display device 101 is provided with a liquid crystal display panel 101P, on which a display area (pixel area), a horizontal driver 101H and a vertical driver 101V are formed, and a timing controller IC 102 that is disposed outside the liquid crystal display panel 101P. The timing controller IC 102 is provided with the Gray code counter 103 according to the embodiment of this invention, a decoder 104H that decodes the Gray code generated by the Gray code counter 103 to generate a horizontal start pulse STH and a decoder 104V that decodes the Gray code generated by the Gray code counter 103 to generate a vertical start pulse STV. The horizontal start pulse STH generated by the timing controller IC 102 is inputted to the horizontal driver 101H and the vertical start pulse STV generated by the timing controller IC 102 is inputted to the vertical driver 101V. The horizontal driver 101H sequentially transfers the horizontal start pulse STH to generate horizontal scan signals and the vertical driver 101V sequentially transfers the vertical start pulse STV to generate vertical scan signals.

Fast operation of the liquid crystal display device 101 as a whole is made possible because the Gray code counter 103 in the liquid crystal display device 101 is capable of fast operation. Since the Gray code counter 103 can be formed of TFTs (Thin Film Transistors), it may be formed together with the horizontal driver 101H and the vertical driver 101V using a low temperature polysilicon technology on a glass substrate that constitutes the liquid crystal display panel 101P. As a result, the liquid crystal display device 101 as a whole can be reduced in size and weight, because the number of semiconductor parts is reduced, the assembly is simplified and a size of an external circuit substrate is also reduced. The Gray code counter according to the embodiment of this invention can be applied not only to the liquid crystal display device, but also to other display devices such as an organic electroluminescence display device.

With the Gray code counter according to the embodiment of this invention, the delay time of the critical path can be reduced and the fast operation is made possible. Also, fast operation of a display device is made possible by using the Gray code counter according to the embodiment of this invention in the display device.

What is claimed is:

1. A Gray code counter that generates a Gray code, comprising:
   a divider circuit that halves a frequency of a clock made of an (n−1) th bit of the Gray code that is one bit lower than a n th bit of the Gray code;
   a delay circuit that delays an output of the divider circuit based on an (n−2) th bit and lower bits of the Gray code; and
   a sequential circuit that holds and delays an output of the delay circuit and outputs the n th bit of the Gray code in response to a clock.

2. The Gray code counter of claim 1, wherein the delay circuit selects the output of the divider circuit when values of the (n−2) th bit and the lower bits of the Gray code are of a first value and selects an output of the sequential circuit when one of the values of the (n−2) th bit and the lower bits of the Gray code is of a second value.

3. The Gray code counter of claim 1, wherein the delay circuit comprises a logical product circuit that generates a logical product of (n−2) bits, which are a first bit through the (n−2) th bit, of the Gray code and a selection circuit that selects the output of the divider circuit when a value of the logical product is of a first value and selects an output of the sequential circuit when the value of the logical product is of a second value.

4. A display device comprising a Gray code counter, the Gray code counter comprising:
   a divider circuit that halves a frequency of a clock made of an (n−1) th bit of the Gray code that is one bit lower than a n th bit of the Gray code;
   a delay circuit that delays an output of the divider circuit based on an (n−2) th bit and lower bits of the Gray code; and
   a sequential circuit that holds and delays an output of the delay circuit and outputs the n th bit of the Gray code in response to a clock.

5. The display device of claim 4, wherein the delay circuit selects the output of the divider circuit when values of the (n−2) th bit and the lower bits of the Gray code are of a first value and selects an output of the sequential circuit when one of the values of the (n−2) th bit and the lower bits of the Gray code is of a second value.

6. The display device of claim 4, wherein the delay circuit comprises a logical product circuit that generates a logical product of (n−2) bits, which are a first bit through the (n−2) th bit, of the Gray code and a selection circuit that selects the output of the divider circuit when a value of the logical product is of a first value and selects an output of the sequential circuit when the value of the logical product is of a second value.

* * * * *